United States Patent [19]

Gorski

[11] 3,969,743

[45] July 13, 1976

[54] PROTECTIVE COATING FOR IV-VI COMPOUND SEMICONDUCTOR DEVICES

[75] Inventor: Daniel A. Gorski, Dearborn Heights, Mich.

[73] Assignee: Aeronutronic Ford Corporation, Blue Bell, Pa.

[22] Filed: Apr. 23, 1975

[21] Appl. No.: 570,632

[52] U.S. Cl. .................................. 357/4; 357/15; 357/30; 357/52; 357/72; 357/73; 357/61
[51] Int. Cl.² ........................................ H01L 29/12
[58] Field of Search ............... 357/4, 15, 30, 61, 73, 357/72, 54

[56] References Cited
UNITED STATES PATENTS

| | | |
|---|---|---|
| 3,663,279 | 5/1972 | Lepselter .............................. 357/54 |
| 3,671,820 | 6/1972 | Haering et al. ........................ 357/4 |
| 3,779,801 | 12/1973 | Halloway et al. ...................... 357/61 |
| 3,796,930 | 3/1974 | Page ...................................... 357/4 |

*Primary Examiner*—John S. Heyman
*Attorney, Agent, or Firm*—Robert D. Sanborn

[57] ABSTRACT

Devices fabricated from certain compound semiconductors of the group IV-VI series are provided with optically transparent coatings of barium fluoride, calcium fluoride, or strontium fluoride. These coating materials are insulators, chemically and electrically inert to the semiconductors, easily applied, and mechanically compatible thus making excellent protective coatings. In addition the coatings can act as diffusion masks in device fabrication thus enhancing planar device processing.

6 Claims, 1 Drawing Figure

U.S. Patent   July 13, 1976   3,969,743
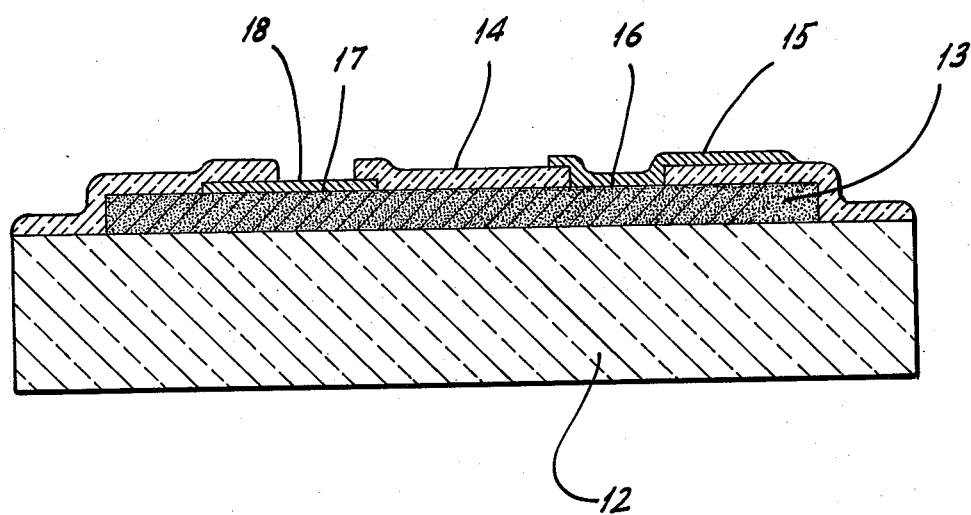

PROTECTIVE COATING FOR IV-VI COMPOUND SEMICONDUCTOR DEVICES

BACKGROUND OF THE INVENTION

It has been found that many of the IV–VI compound semiconductors have very useful device properties. Excellent photodetectors, lasers, photo emitter diodes, and electro optical elements have been fabricated. Many of these devices have excellent infrared optical properties and function at relatively modest temperatures. It has been found that when such devices are fabricated in the form of useful structures, surface protective coatings are advantageously employed, particularly when p-n junctions or barrier-forming contacts in thin film structures are used. In the past such coatings have been composed of silicon dioxide or silicon monoxide deposited by conventional means. These coatings provide most of the desired protective coating properties but leave much to be desired in terms of mechanical compatibility. The IV–VI compounds of maximum interest have rather large thermal expansion coefficients that do not match silicon monoxide or dioxide. This means that the protective coatings are under severe stress and tend adversely to affect the electrical properties of the devices. In addition reasonably thick coatings tend to crack or craze particularly when cycled to cryogenic temperatures. In the case of thin film devices such mechanical stress can warp the devices and alter their form.

SUMMARY OF THE INVENTION

It is an object of the invention to provide protective coatings for IV–VI compound semiconductor devices.

It is a further object of the invention to coat IV–VI compound semiconductor devices with easily deposited materials that are electrically, chemically, and mechanically compatible with the devices.

These and other objects are accomplished as follows. The invention applies to the semiconductors lead telluride, lead selenide, alloys of lead telluride and lead selenide, lead sulfide, alloys of lead sulfide and lead selenide, tin substituted lead telluride and lead selenide, germanium substituted lead telluride, and cadmium substituted lead sulfide. Semiconductor devices fabricated from these IV–VI compound semiconductors are provided with protective coatings of barium fluoride, calcium fluoride, or strontium fluoride.

Such coatings can be applied by vacuum evaporation in substantial thickness and provide excellent protection. They are chemically inactive, have no adverse electrical effects, adhere well and are a good thermal expansion match. Coated devices can be repeatedly cycled from room temperature to cryogenic temperatures without adverse effect. The coatings can also be used in diffusion masking thereby making them useful in device fabrication.

BRIEF DESCRIPTION OF THE DRAWING

The single FIGURE of drawing shows in cross-section a device fabricated with a coating in accordance with the invention.

DESCRIPTION OF THE INVENTION

Referring to the drawing, substrate 12 is a single crystal of barium fluoride or some other suitable material. A layer of semiconductor 13 is heteroepitaxed onto substrate 12. In this operation a thin layer of semiconductor is vapor phase grown onto a suitable seed crystal. It has been found that single crystal barium fluoride (or strontium fluoride) is an excellent substrate for IV-VI compound semiconductors. It is an insulator and will provide the kind of surface onto which a single crystal semiconductor layer can be deposited in epitaxial form. This process is taught in an article in the Journal of Nonmetals, volume 1, pages 347-354 (1973), by Henry Holloway and titled GROWTH AND APPLICATIONS OF EPITAXIAL IV-VI COMPOUNDS.

In accordance with the invention the semiconductor layer 13 can be lead telluride (Pb Te), lead selenide (Pb Se), alloys thereof (Pb $Te_x Se_{1-x}$), lead sulfide (Pb S), alloys of lead sulfide and lead selenide (Pb $S_x Se_{1-x}$), tin substituted lead telluride (Pb$_x$ Sn$_{1-x}$ Te), tin substituted lead selenide (Pb$_x$ Sn$_{1-x}$ Se), germanium substituted lead telluride (Pb$_x$ Ge$_{1-x}$ Te), and cadmium substituted lead sulfide (Pb$_x$ Cd$_{1-x}$ S). All of these IV–VI compound semiconductors can be grown in single crystal form and can be epitaxially grown in film form on a single crystal barium fluoride (or strontium fluoride) surface.

The deposited semiconductor 13 is covered (except for contact regions) with a protective layer 14 that can be barium fluoride (BaF$_2$), calcium fluoride (Ca F$_2$), or strontium fluoride (Sr F$_2$). Ba F$_2$ is preferred as the coating material. However, where the devices are to be exposed to water Ca F$_2$ is preferred. Sr F$_2$, which has the lowest melting temperature of the three fluorides, also has water solubility slightly less than Ba F$_2$. Layer 14 can be vacuum evaporated and deposited in fine polycrystalline form. Its thickness while not critical is preferred in the range of 0.2 to 1 micron. Layers as thin as 200 angstroms and as thick as 2 microns have proven successful.

Metal contact 15, which may be lead for P-type semiconductors, makes a rectifying or Schottky barrier contact on the semiconductor at 16. Ohmic contact at 17 can be made with platinum layer 18 prior to covering with the protective coating. The metal contact 15 is made to contact the semiconductor through holes in the protective coating 14 and extend over a portion of the coating where contact to the metal can be made by any one of several means well known in the semiconductor art. If the device is electrooptical in nature it can be illuminated through substrate 12. By means of the construction shown the thickness of film 13 can be made such that the optical activity in the region of the rectifying barrier 16 is very efficient.

While the drawing shows a thin semiconductor film epitaxed onto a single crystal substrate, other constructions can be employed. For example the IV–VI compound semiconductors can be grown in bulk, by means known in the art, and processed into devices by conventional means. Also, instead of the Schottky barrier contact, junction regions can be established in the device by diffusion, ion implantation, or other junction forming means. Such devices can be provided with the protective coatings of the invention. The coatings should be applied in the regions where electrical barriers will occur, but, if desired, the entire device except where contacts are required can be coated because the coating will not interfere with optical performance.

When the Schottky barrier contacts are replaced with P-N junctions, the action of the coating as a diffusion resist becomes important. In this respect an area of the semiconductor is first coated with the metal forming the ohmic contact. It is then coated with the protective coating described except where a P-N junction and access to the ohmic contact is desired. The assembly is then subjected to high temperature in an atmosphere containing a quantity of vapor of a material that will dope the semiconductor as desired. Where the coating exists the vapor will not penetrate so that a P-N junction can be created directly in registry with holes in the coating. In this process the protective coating can be used much in the same manner as the oxide is used in the well-known planar device fabrication process. The high melting temperatures of the fluoride compounds set forth along with their chemical inertness make the above process practical.

It should be recognized that the above description shows only a single ohmic and a single rectifying contact. In practice the invention will be used on a relatively large area substrate and on a profusion of devices simultaneously. It may be that a large number of single photo devices are made simultaneously in a batch and the substrate subsequently cut apart to yield the individual devices. Alternatively arrays of devices can be fabricated. Here a plurality of photo devices are present as a unit. The devices for example can be in a linear array or a two dimensional array can be employed. A single substrate can contain a single array composed of many diodes or a plurality of smaller arrays can be fabricated simultaneously.

EXAMPLE 1

A photo diode was fabricated in accordance with the drawing as follows:

A 0.47 micron layer of Pb Te was epitaxially deposited onto a freshly cleaved surface of a single crystal of Ba $F_2$ at about 350°C and annealed in accordance with conventional practice. The substrate was coated with photoresist about two microns thick which was processed to remove it where metal layer 18 was desired. Then platinum was r-f sputtered for 10 minutes to provide a platinum layer about 1500 angstroms thick. The photoresist was then stripped leaving the metal only where it contacted the Pb Te.

A two micron layer of photoresist was again deposited and processed to leave resist dots in accordance with the desired contact areas. Ba $F_2$ was vacuum evaporated over the structure to a thickness of about 0.2 micron at a rate of about 1.5 microns per minute. The resist was then stripped leaving holes in the Ba $F_2$ coating where contacts are desired. The substrate was covered with a close spaced metal mask with openings where metal layer 15 was to be located. The substrate was then vacuum coated with lead at a rate of about 3,000 angstroms per minute to a thickness of about 3,000 angstroms. The mask was removed leaving the rectifying lead film contact, completing the structure of the drawing. Leads were then attached to metal contacts 15 and 18 and the device mounted in a suitable housing.

These devices had (peak detectivities) D* of 8.1 × $10^{10}$ cm $Hz^{1/2}$ $W^{-1}$ at 3.8 microns when operated at 84°K, and D* of 4.9 × $10^{10}$ cm $Hz^{1/2}$ $W^{-1}$ at 3.8 microns when operated at 170°K.

EXAMPLE 2

A photo diode was fabricated in accordance with the drawing as follows:

A 1.13 micron layer of Pb $Se_{.8}$ $Te_{.2}$ was epitaxially deposited onto a freshly cleaved surface of a single crystal of Ba $F_2$ at about 350°C and annealed in accordance with conventional practice. The substrate was coated with photoresist about two microns thick which was processed to remove it where metal layer 18 was desired. Then platinum was r-f sputtered for 10 minutes to provide a platinum layer about 1500 angstroms thick. The photoresist was then stripped leaving the metal only where it contacted the Pb $Se_{.8}$ $Te_{.2}$.

A two micron layer of photoresist was again deposited and processed to leave resist dots in accordance with the desired contact areas. Ba $F_2$ was vacuum evaporated over the structure to a thickness of about 1.4 micron at a rate of about 1.5 microns per minute. The resist was then stripped leaving holes in the Ba $F_2$ coating where contacts are desired. The substrate was then recoated with a two micron layer of resist which was processed to remove it where metal layer 15 was to be located. The substrate was then vacuum coated with lead at a rate of about 3,000 angstroms per minute to a thickness of about 3,500 angstroms. The resist was then stripped leaving the rectifying lead film contact, completing the structure of the drawing. Leads were then attached to metal contacts 15 and 18 and the device mounted in a suitable housing.

The resulting photo diodes had (peak detectivities) D* of 6 × $10^{10}$ cm $Hz^{1/2}$ $W^{-1}$ at 4.5 microns when operated at 170°K.

EXAMPLE 3

A photo diode was fabricated in accordance with the drawing as follows:

A 1.4 micron layer of $Pb_{.934}$ $Sn_{.066}$ Se was epitaxially deposited onto a freshly cleaved surface of a single crystal of Ba $F_2$ at about 350°C and annealed in accordance with conventional practice. The substrate was coated with photoresist about two microns thick which was processed to remove it where metal layer 18 was desired. Then platinum was r-f sputtered for 10 minutes to provide a platinum layer about 1300 angstroms thick. The photoresist was then stripped leaving the metal only where it contacted the $Pb_{.934}$ $Sn_{.066}$ Se.

A two micron layer of photoresist was again deposited and processed to leave resist dots in accordance with the desired contact areas. Ba $F_2$ was vacuum evaporated over the structure to a thickness of about 1 micron at a rate of about 1.5 microns per minute. The resist was then stripped leaving holes in the Ba $F_2$ coating where contacts are desired. The substrate was then recoated with a two micron layer of resist which was processed to remove it where metal layer 15 was to be located. The substrate was then vacuum coated with lead at a rate of about 3,000 angstroms per minute to a thickness of about 7,000 angstroms. The resist was then stripped leaving the rectifying lead film contact, completing the structure of the drawing. Leads were then attached to metal contacts 15 and 18 and the device mounted in a suitable housing.

The resulting photo diodes had (peak detectivities) D* of 2.6 × $10^{10}$ cm $Hz^{1/2}$ $W^{-1}$ at 10 microns when operated at 81°K.

Using the above process photodiodes having active areas in the range of $10^{-3}$ to 6 × $10^{-5}$ $cm^2$ were easily fabricated. Diode arrays, both linear and two dimensional were fabricated with good yield.

My invention has been described and detailed examples set forth. Clearly a person skilled in the art will be aware of alternatives and equivalents. Accordingly it is intended that my invention be limited only by the following claims.

I claim:

1. A semiconductor device for use in a low temperature, moistureless ambient comprising:
    a single crystal barium fluoride substrate,
    a semiconductor deposited on said substrate, said semiconductor being selected from the group consisting of lead telluride, lead selenide, alloys of lead telluride and lead selenide, lead sulfide, alloys of lead sulfide and lead selenide, tin substituted lead telluride, tin substituted lead selenide, germanium substituted lead telluride, and cadmium substituted lead suffide,
    means for making electrical contact to selected areas of said semiconductor, and
    a protective coating covering said semiconductor, said coating being selected from the group consisting of barium fluoride and strontium fluoride.

2. The device of claim 1 wherein said coating is in the form of a thin film of fine polycrystals.

3. The device of claim 2 wherein said semiconductor is in thin film form, said film being epitaxially deposited on said single crystal substrate.

4. The device of claim 3 wherein said single crystal substrate is composed of the same material as said coating.

5. The device of claim 4 wherein said semiconductor is lead telluride.

6. A semiconductor device for use in a low temperature, moistureless ambient comprising:
    a semiconductor selected from the group consisting of lead telluride, lead selenide, alloys of lead telluride and lead selenide, lead sulfide, alloys of lead sulfide and lead selenide, tin substituted lead telluride, tin substituted lead selenide, germanium substituted lead telluride, and cadmium substituted lead sulfide,
    means for making electrical contact to selected areas of said semiconductor, and
    a protective coating covering said semiconductor, said coating being selected from the group consisting of barium fluoride and strontium fluoride.

* * * * *